(12) United States Patent
Yeh

(10) Patent No.: US 8,092,242 B2
(45) Date of Patent: Jan. 10, 2012

(54) SOCKET WITH AN EASILY OPERATED COVER

(75) Inventor: Cheng-Chi Yeh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/494,317

(22) Filed: Jun. 30, 2009

(65) Prior Publication Data

US 2009/0325403 A1  Dec. 31, 2009

(30) Foreign Application Priority Data

Jun. 30, 2008  (TW) .................................. 097211558

(51) Int. Cl.
*H01R 13/62* (2006.01)

(52) U.S. Cl. ...................................................... 439/331

(58) Field of Classification Search .................. 439/331, 439/260, 342, 71, 73
See application file for complete search history.

(56) References Cited

U.S. PATENT DOCUMENTS 6,485,320 B1 * 11/2002 Ma ................................. 439/342
7,438,580 B1 * 10/2008 Aoki et al. .................... 439/331

* cited by examiner

*Primary Examiner* — Briggitte R Hammond
(74) *Attorney, Agent, or Firm* — Andrew C. Cheng; Wei Te Chung; Ming Chieh Chang

(57) ABSTRACT

A socket, mounted on a printed circuit board for electrically connecting an IC package, comprises an insulative housing receiving a plurality of contacts, a linking member and a cover. The insulative housing and the linking member are mounted on the printed circuit board, and the linking member is located beside of the insulative housing. The cover is formed with a first end pivotally assembled to the linking member and a second end opposite to the first end. The second end is provided with a tongue portion to be retained to the printed circuit board by a screw and a projecting piece extending from a side of the tongue portion to be handled by operator to lift and open the cover.

18 Claims, 3 Drawing Sheets

SOCKET WITH AN EASILY OPERATED COVER

FIELD OF THE INVENTION

The present invention relates to a socket for connecting an IC package and a printed circuit board, and more particularly to a socket formed with an easily operated cover.

DESCRIPTION OF RELATED ART

Electrical connector is widely used in electrically connecting an IC package and a printed circuit board, usually, such a connector, adapted in desktop computer, comprises an insulative housing with a plurality of contacts, a stiffener surrounding the insulative housing, a cover pivotally assembled to an end of the stiffener and a lever pivotally assembled to an opposite end of the stiffener. The insulative housing defines a receiving space for receiving the IC package. The cover has a tongue portion at an opposite end relative to the end thereof pivotally assembled with the stiffener. The lever has an L-shape configuration, including an actuating portion pivotally assembled to the stiffener and an operating portion vertical to the actuating portion for being handled by operator, and the actuating portion has a pressing portion in a middle thereof. When the cover is originally located on an opened position relative to the insulative housing, the IC package is put in the receiving space of the insulative housing, then the cover rotates downwardly to cover the insulative housing and press the IC package toward the insulative housing, finally, the lever is operated to rotate downwardly to make the pressing portion thereof press the tongue portion of the cover, and the lever is retained by a hook disposed on the stiffener which locks the operating portion of the lever, thereby the connector can reliably connects the IC package and the printed circuit board. When the IC package needs to remove, release and open the lever, then press a tail disposed on the end of the cover pivotally assembled to the stiffener or handle lateral sides of the cover, so the cover will be lifted to rotate upwardly to an opened position relative to the insulative housing. However, in fact, the tail usually is a smart part, and the lateral sides are very close to the printed circuit board, the cover can not be easily lifted for operator.

The notebook computer often uses another type of connector which does not have a lever for there is no enough room in the notebook computer for the lever, such connector defines a hole on the tongue portion of the cover, and a blot passes through the hole and directly mounts the cover to the printed circuit board. To ensure the cover can reliably press the IC package, the tongue portion commonly abuts against the printed circuit board. That may bring difficulties for operator to remove the IC package.

Hence, an improved socket is required to overcome the above-mentioned disadvantages of the related art.

SUMMARY OF THE INVENTION

Accordingly, an object of the present invention is to provide a socket with a cover, which has a projecting piece for being easily handled by operator.

To achieve the aforementioned objects, a socket, for receiving an IC package, comprises an insulative housing receiving a plurality of contacts therein and a cover covering the insulative housing and being rotatable relative to the insulative housing. The cover has a first end and a second end opposite to the first end. The second end is formed with a tongue portion and a projecting piece adjacent to the tongue portion, and an adequate space is defined under the projecting piece.

Other objects, advantages and novel features of the invention will become more apparent from the following detailed description of a preferred embodiment when taken in conjunction with the accompanying drawings.

DETAILED DESCRIPTION OF THE INVENTION

Reference will now be made to the drawings to describe the present invention in detail.

Figure 1:
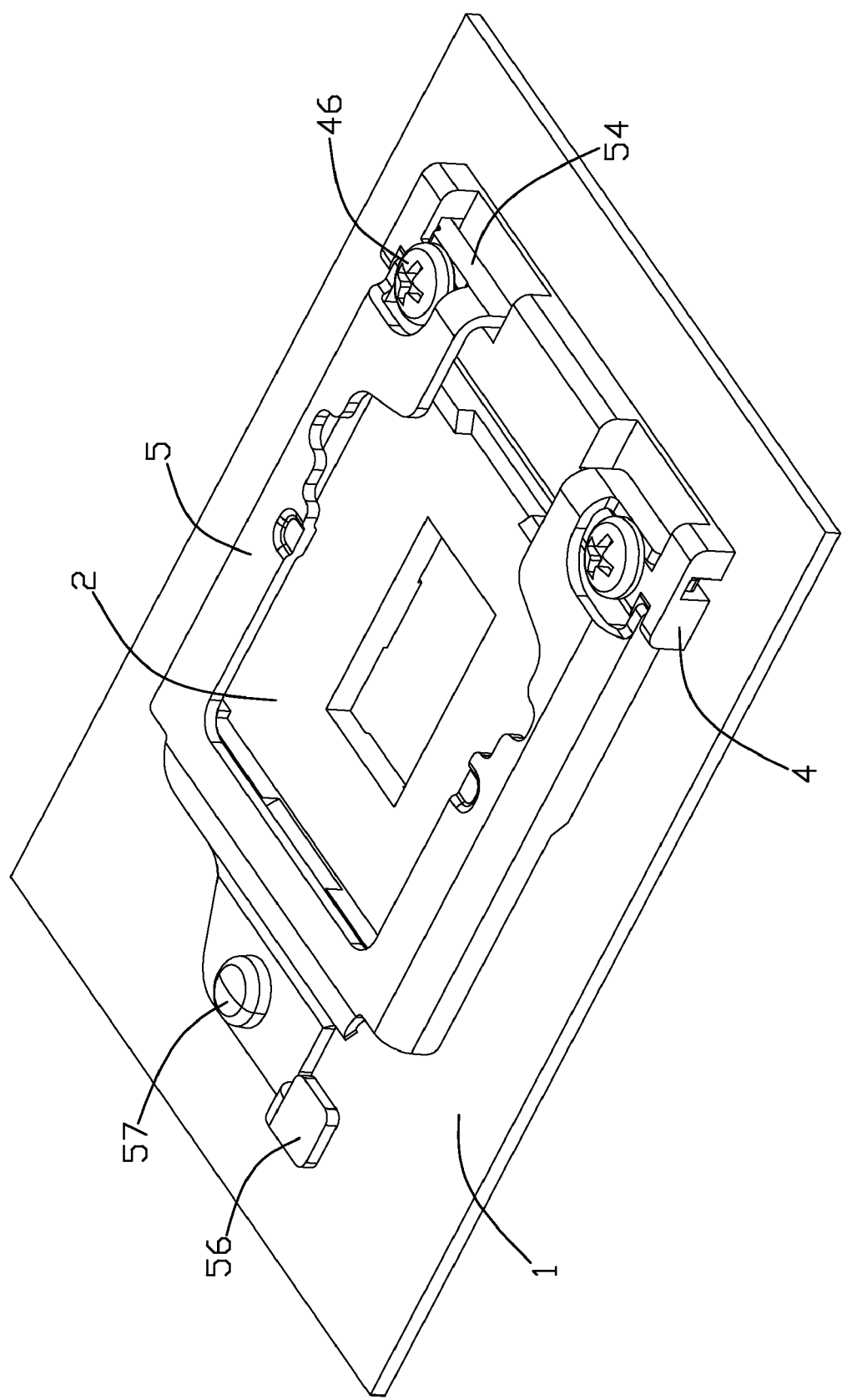
FIG. 1 is an assembled, perspective view of a socket in accordance with present invention.
Figure 2:
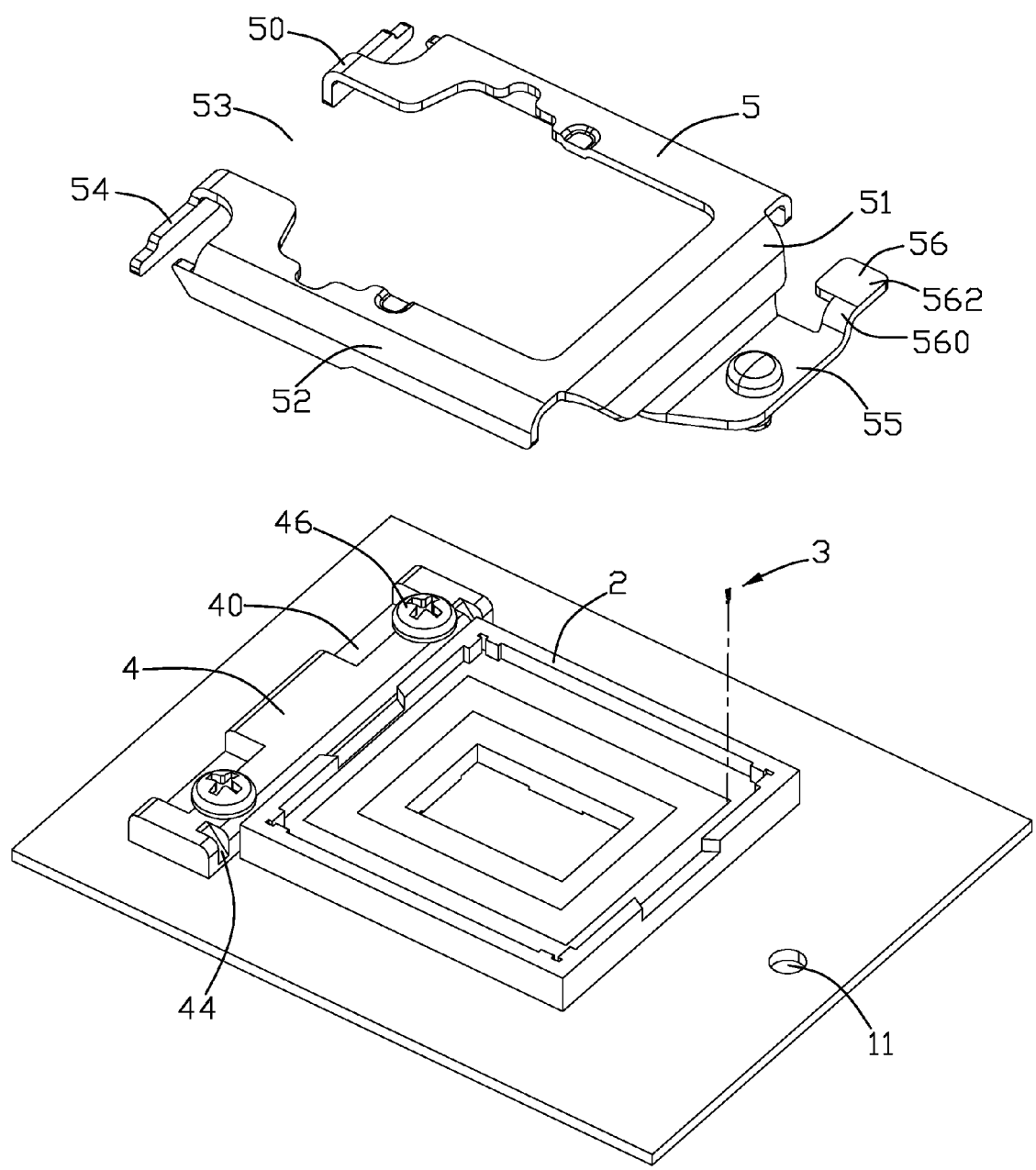
FIG. 2 is a partially explored, perspective view of the socket in accordance with present invention.
Figure 3:
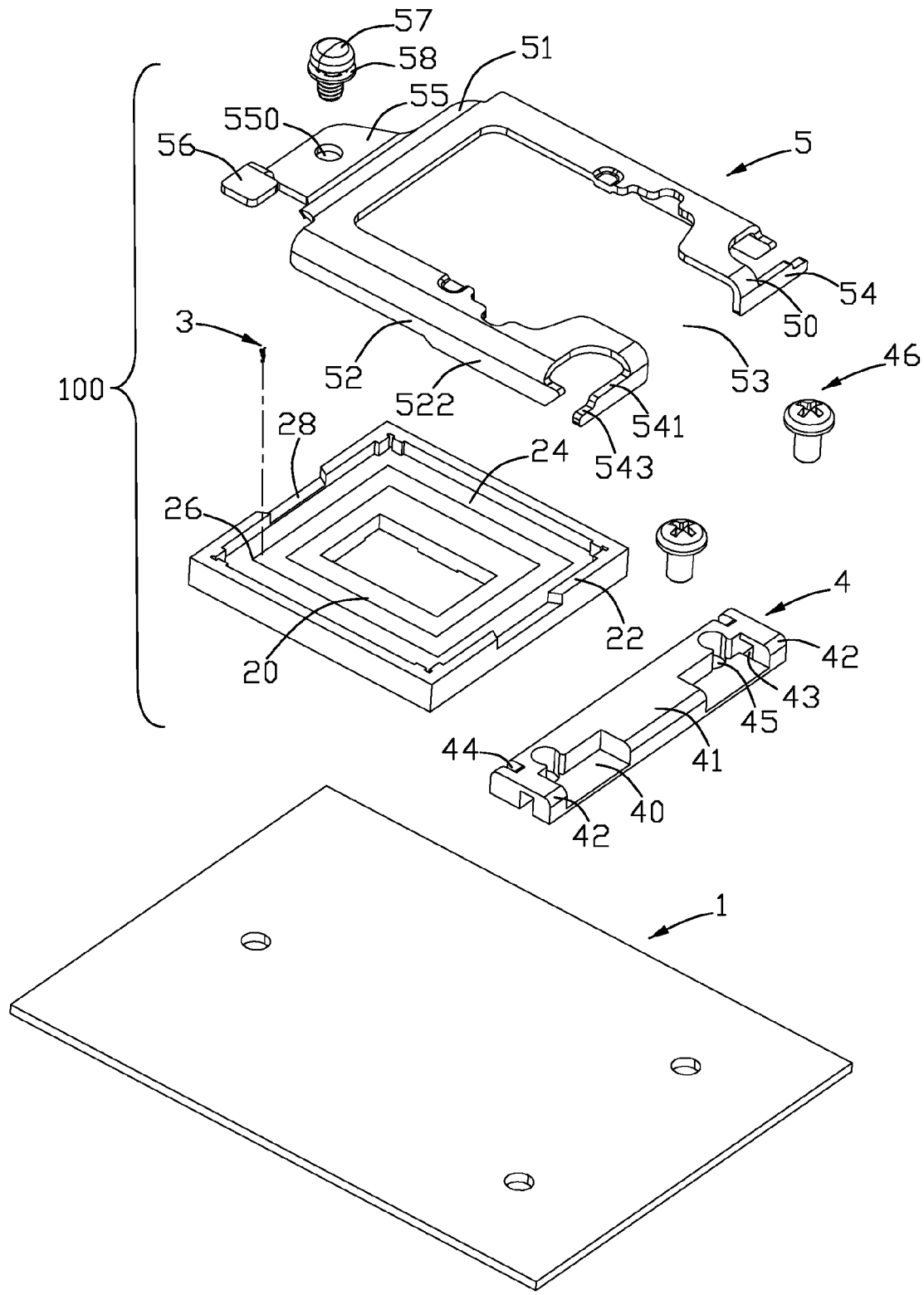
FIG. 3 is an explored, perspective view of the socket in accordance with present invention.

FIGS. 1-3 show a socket 100 of a preferred embodiment in accordance with present invention. The socket 100, mounted on a printed circuit board 1 for receiving an IC package (not shown), comprises an insulative housing 2, a plurality of contacts 3 installed on the insulative housing 2, a linking member 4 disposed on a side of the insulative housing 2 and a cover 5 pivotally assembled to the linking member 4 and covering the insulative housing 2.

The insulative housing 2 has a substantially rectangular configuration, and comprises a bottom wall 20 and a plurality of sidewalls 22 extending upwardly from a peripheral of the bottom wall 20, and the bottom wall 20 and the sidewalls 22 define a cavity 24 for receiving the IC package (not shown) together. The bottom wall 20 further defines a plurality of passageways 26 in array, and the contacts 3 are disposed in corresponding passageways 26, respectively. One pair of opposite sidewalls 22 of the sidewalls 22 each defines a cutout 28, so that operator can easily handle the IC package (not shown) in the cavity 24 in virtue of the cutout 28. The insulative housing 2 is mounted on the printed circuit board 1, the contacts 3 are soldered to the printed circuit board 1.

The linking member 4 is mounted on the printed circuit board 1 and beside the insulative housing 2. The linking member 4 is molded by resin and has an elongated configuration and extends along an adjacent sidewall 22. The linking member 4 defines a pair of recesses 40 recessed downwardly from two opposite ends of an out edge thereof which is away from the insulative housing 2. A flange 41 is provided between the two recesses 40, and a blocking clump 42 is formed on an outside of each recess 40 and has a perforation 43 extending laterally therethrough and communicating with the recess 40. The linking member 4 defines a pair of slots 44 recessed downwardly from two opposite ends of an inner edge thereof. The linking member 4 further has two mounting holes 45 passing therethrough along a top-to-bottom direction on two opposite ends thereof, and also partially extending though the bottom of the recess 40. A pair of blots 46 inert through the mounting holes 45 and two first through holes 10 defined on the printed circuit board 1 to assemble the linking member 4 on the printed circuit board 1 and beside the insulative housing.

The cover 5 is stamped from a metal sheet with a substantially frame shape. The cover 5 covers the insulative housing 2 and rotates relative to the insulative housing 2. The cover 5 has a first end 50, a second end 51 opposite to the first end 50 and two lateral portions 52 which link the first end 51 and the second end 52. A middle part of the first end 50 is cut to define a gap 53. The first end 50 further has a pair of opposite shafts 54 which are bent downwardly from a rear edge of the first end 50 near the gap 53 and extending laterally and outwardly, respectively. The shaft 54 comprises an abutting portion 541 and a rotating portion 543 with a narrow width relative to the abutting portion 541. The lateral portion 52 has a lateral edge 522 extending downwardly. The second end 51 has a tongue portion 55 extending aslant and downwardly, the tongue portion 55 defines an engaging hole 550 in a center thereof corresponding to a second through hole 11 defined on the printed circuit board 1. The first end 50 further has a projecting piece 56 protruding from a side of the tongue portion 55 and disposed in the rear of the first end 51 and beside the tongue portion 55. The projecting piece 56 has a connecting portion 560 extending aslant and upwardly from the side of the tongue portion 55 and an operating portion 562 extending horizontally from the connecting portion 560. There is adequate space under the operating portion 562 so a finger of operator may easily insert the space and handle the projecting piece 56. A screw 57 passes the engaging hole 550 of the tongue portion 55 and locks with a washer 58 to be retained on the tongue portion 55.

The shafts 54 of the cover 5 are disposed on the recesses 40 of the linking member 4, respectively; the rotating portion 543 of the shafts 54 insert the perforations 43 of the linking member 4 to pivotally assemble the cover 5 to the linking member 4; the flange 41 of the linking member 4 and the gap 53 of the cover 5 can engage with each other to limit the cover 5 swinging during a rotation process, and the slots 44 of the linking member 4 engage with the lateral edges 522 to further limit the swinging of the cover 5.

When using, open the cover 5 and put the IC package (not shown) in the cavity 24 of the insulative housing 2, and then rotate the cover 5 to cover the insulative housing 2, finally, lock the screw 57 assembled on the tongue portion 55 into the second through hole 11 of the printed circuit board 1, so the cover 5 is reliably fastened. When the cover 5 rotates, the abutting portion 54 of the shaft 54 of the cover 5 will abut against the blot 46, and the rotating portion 543 will not contact an upper wall of the perforation 43 of the linking member 4, so the abutting portion replaces the rotating portion 543 to be the axis of rotation, by this design, the blot 46 can support the pressure occurred during the rotation of the cover 5 and protect the linking member 4.

When removing the IC package (not), the screw 57 screws up from the printed circuit board 1, and then operator may pull the operating portion 562 of the projecting piece 56 upwardly to lift the second end 51 up and open the cover 5. The projecting piece 56 of the socket 100 is disposed on a side of the tongue portion 55 so as not to occupy a room of the printed circuit board 1, and the projecting piece 56 is made from a part of the cover 5 which is originally abandoned by cutting, thereby the projecting piece 56 will not add a cost of the soc However, the disclosure is illustrative only, changes may be made in detail, especially in matter of shape, size, and arrangement of parts within the principles of the invention.

What is claimed is:

1. A socket, for receiving an IC package, comprising:
    an insulative housing receiving a plurality of contacts therein; and
    a cover covering the insulative housing and being rotatable relative to the insulative housing, the cover having a first end and a second end opposite to the first end, the second end formed with a tongue portion and a projecting piece besides the tongue portion, an adequate space being defined under the projecting piece when the cover covers the insulative housing, the adequate space being located outside the socket thereby allowing a finger to insert therein, wherein the projecting piece has a connecting portion extending aslant and upwardly from the tongue portion and an operating portion horizontally extending from the connecting portion, the operating portion substantially has a planar surface to be handled by operator to lift the second end of the cover.

2. The socket as claimed in claim 1, further comprising a linking member located besides the insulative housing, the first end of the cover is pivotally assembled to the linking member.

3. The socket as claimed in claim 2, wherein the cover has two lateral portions connecting the first end and the second end, a middle of the first end is cut to define a gap.

4. The socket as claimed in claim 3, wherein the second end of the cover has a pair of shafts, the linking member defines two recesses receiving the shafts of the cover and two perforations for the shafts passing through.

5. The socket as claimed in claim 4, wherein the linking member has a flange between the two recesses, which can engage with the gap of the cover to limit the cover swinging.

6. The socket as claimed in claim 3, wherein the linking member defines a pair of slots recessed downwardly from two opposite ends of an inner edge thereof, the lateral portions of the cover having lateral edges engaging with the slots to further limit the swinging of the cover.

7. A socket, for electrically connecting an IC package and a printed circuit board, comprising:
    an insulative housing receiving a plurality of contacts and mounted on the printed circuit board;
    a linking member mounted on the printed circuit board and beside the insulative housing; and
    a cover formed with a first end pivotally assembled to the linking member and a second end opposite to the first end, the second end provided with a tongue portion to be retained to the printed circuit board by a retainer and a projecting piece being adjacent to the tongue portion, the projecting piece located out of a space between the first end and the second end so as to be handled to lift the cover, wherein the projecting piece is spaced to the second end and comprises a connecting portion directly connecting with a lateral edge of the tongue portion and extending aslant and upwardly from the tongue portion and an operating portion horizontally extending from the connecting portion, the operating portion substantially has a planar surface to be handled by an operator to lift the second end of the cover.

8. The socket as claimed in claim 7, wherein a space is defined under the projecting piece for insertion of finger of operator when the cover is retained to the printed circuit board.

9. The socket as claimed in claim 7, wherein the cover has two lateral portions connecting the first end and the second end, a middle of the first end is cut to define a gap.

10. The socket as claimed in claim 7, wherein the second end of the cover has a pair of shafts, the linking member defines two recesses receiving the shafts of the cover and two perforations for free ends of the shafts passing through.

11. The socket as claimed in claim 7, wherein the retainer is a screw.

12. A socket assembly comprising:
    a printed circuit board;
    a connector including an insulative housing mounted upon the printed circuit board; and
    a metallic cover mounted upon the housing and being pivotable relative to the housing with a pivotal end and a distal moving end opposite to said pivotal end; wherein a raised projection is formed on said distal moving end to be spaced from the printed circuit board with a gap larger than that between the printed circuit board and a tongue portion which is formed at said distal moving end and locked to the printed circuit board; wherein said raised projection extends outwardly and laterally with a laterally projecting area thereof for easily manually lifting up the metallic cover.

13. The socket assembly as claimed in claim 12, further including a linking member to which said pivotal end is mounted.

14. The socket assembly as claimed in claim 13, wherein said linking member is locked to the printed circuit board.

15. The socket assembly as claimed in claim 12, wherein said projection extends laterally from the tongue portion.

16. The socket assembly as claimed in claim 12, wherein said distal moving end is fastened to the printed circuit board via a screw.

17. The socket assembly as claimed in claim 12, the projection is located beside the tongue portion in a transverse direction which is perpendicular to a front-to-back direction defined by said pivotal end and said distal moving end.

18. The socket assembly as claimed in claim 17, wherein the connector is arranged to leave enough space around the raised projection so as to allow a user to easily approach the gap under the raised projection for manual operation.

* * * * *